(12) United States Patent
Lee

(10) Patent No.: US 7,674,700 B2
(45) Date of Patent: Mar. 9, 2010

(54) APPARATUS FOR MANUFACTURING SEMICONDUCTOR DEVICE AND METHOD FOR MANUFACTURING SEMICONDUCTOR DEVICE USING THE SAME

(75) Inventor: Han Choon Lee, Songpa-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/895,324

(22) Filed: Aug. 24, 2007

(65) Prior Publication Data
US 2008/0057700 A1 Mar. 6, 2008

(30) Foreign Application Priority Data
Aug. 31, 2006 (KR) ............. 10-2006-0083332

(51) Int. Cl.
*H01L 21/28* (2006.01)

(52) U.S. Cl. ............ 438/605; 438/627; 438/687; 438/680; 438/597; 257/379; 257/750; 257/773

(58) Field of Classification Search ........... 438/597, 438/782, 612, 231, 627, 687, 643, 680
See application file for complete search history.

(56) References Cited

U.S. PATENT DOCUMENTS

| | | | |
|---|---|---|---|
| 6,251,771 B1* | 6/2001 | Smith et al. ............. | 438/626 |
| 6,271,136 B1 | 8/2001 | Shue et al. | |
| 6,498,091 B1 | 12/2002 | Chen et al. | |
| 6,566,246 B1* | 5/2003 | de Felipe et al. ......... | 438/627 |
| 6,576,546 B2* | 6/2003 | Gilbert et al. ............ | 438/629 |
| 2004/0002220 A1* | 1/2004 | Mizushima ............. | 438/706 |
| 2004/0175944 A1* | 9/2004 | Kobayashi ............. | 438/689 |
| 2006/0148253 A1* | 7/2006 | Chung et al. ............ | 438/681 |

OTHER PUBLICATIONS

Partial Chinese Office Action dated Oct. 17, 2008; Chinese Patent Application No. 2007101483521; The State Intellectual Property Office of P.R.C., People's Republic of China.

* cited by examiner

*Primary Examiner*—William M Brewster
*Assistant Examiner*—Wilner Jean Baptiste
(74) *Attorney, Agent, or Firm*—The Law Offices of Andrew D. Fortney; Andrew D. Fortney; Sharon E. Brown Turner

(57) ABSTRACT

Disclosed are an apparatus and a method for manufacturing a semiconductor device. The apparatus comprises a transfer chamber for transferring a substrate, a first process chamber connected to the transfer chamber configured to form a TiSiN layer on the substrate, a second process chamber connected to the transfer chamber configured to form a tantalum layer on the TiSiN layer, and a third process chamber connected to the transfer chamber configured to form a copper seed layer on the tantalum layer. After forming the TiSiN layer, a portion of the TiSiN layer in contact with the lower metal interconnection is etched, the tantalum layer is formed on the TiSiN layer in contact with the exposed lower metal interconnection, the copper seed layer is formed on the tantalum layer, and then the copper interconnection is formed on the copper seed layer. In this way, the copper interconnection can be efficiently formed.

19 Claims, 10 Drawing Sheets

APPARATUS FOR MANUFACTURING SEMICONDUCTOR DEVICE AND METHOD FOR MANUFACTURING SEMICONDUCTOR DEVICE USING THE SAME

PRIORITY CLAIM

This Non-provisional application claims priority under 35 U.S.C. §119(a) to Korean Patent Application No. 0083332/2006 filed Aug. 31, 2006, the subject matter of which is hereby incorporated by reference.

BACKGROUND

Embodiments of the invention relate to an apparatus for manufacturing a semiconductor device and a method for manufacturing the semiconductor device using the same.

Recently, as a semiconductor device has rapidly become highly integrated and operated at a high speed, the dimension of a transistor has become gradually reduced. As the integration degree of a transistor increases, the dimension of interconnection of the semiconductor device becomes reduced. As a result, signals applied to the interconnection may be delayed or distorted and thus a high-speed operation of the semiconductor device can be interrupted.

In order to solve such a problem, a copper interconnection has been rapidly developed. The copper interconnection uses copper, which has resistance lower than that of aluminum or aluminum alloy that has been widely utilized as interconnection material of a semiconductor device and that has higher electro-migration.

In general, in order to form a copper interconnection, processes for forming and etching a copper layer are necessary. However, the copper layer has poor etching uniformity and the surface of the copper interconnection is rapidly oxidized while the copper layer is being etched.

In order to solve such a problem, a damascene process has been recently developed to form a copper interconnection.

According to the damascene process, a via hole and/or a trench are formed in an insulation layer, a copper layer is deposited in the trench and the via hole, and then the copper layer is planarized through a Chemical Mechanical Polishing (CMP) process, thereby forming a copper interconnection in the trench and the contact hole. That is, in the damascene process, since the copper interconnection is formed without etching the copper layer, the problem can be solved in which the copper interconnection is oxidized while the copper layer is being etched.

The afore-described damascene process can also be used for forming the bit or word lines of a semiconductor device in addition to a metal interconnection. In particular, according to the damascene process, contact holes (or via holes) for interconnecting an upper metal interconnection and a lower metal interconnection in a multilayer metal interconnection can be simultaneously formed, and a step coverage caused by the metal interconnections can be removed.

However, the copper interconnection having such advantages also has problems in that copper ions included therein are diffused so that the properties of the copper interconnection may deteriorate, and short-circuit may occur between adjacent copper interconnections.

In order to solve such a problem, a diffusion barrier is generally formed on the inner walls of a trench and/or a via hole in order to prevent the diffusion of copper atoms or ions into the insulation layer and/or oxygen atoms from the insulation layer into the copper. The diffusion barrier mainly has a TaN/Ta double layer structure (i.e. a TaN layer on a Ta layer), and is formed through a Physical Vapor Deposition (PVD) process such as a sputtering process. However, when forming a TaN/Ta double layer through the PVD process, step coverage may be less than ideal or satisfactory, and contact resistance of the via/contact may be reduced. As a result, research into a method for forming a TaN layer or a Ta layer through an Atomic Layer Deposition (ALD) process has been recently pursued. However, when forming the TaN layer or the Ta layer through the ALD process, the procedure becomes complicated and the productivity is significantly reduced.

Further, the TaN layer or the Ta layer used as a diffusion barrier increases resistivity and/or electro-migration properties of the conductive layer(s) in a semiconductor device.

SUMMARY

In order to accomplish an object of the present invention, there is provided an apparatus for manufacturing a semiconductor device, the apparatus comprising: a transfer chamber for transferring a substrate; a first process chamber connected to the transfer chamber configured to form a TiSiN layer on the substrate; a second process chamber connected to the transfer chamber configured to form a tantalum layer on the TiSiN layer; and a third process chamber connected to the transfer chamber configured to form a copper seed layer on the tantalum layer.

In order to accomplish another object of the present invention, there is provided a method for manufacturing a semiconductor device having an insulation layer with a trench and/or contact hole that exposes a lower conductive interconnection, the method comprising the steps of: depositing a TiSiN layer on inner walls of the trench; exposing the lower interconnection by selectively removing a portion of the TiSiN layer that covers a bottom surface of the trench in a second process chamber; forming a tantalum layer on the TiSiN layer and the exposed lower interconnection in the second process chamber; forming a copper seed layer on the tantalum layer in a third process chamber; and forming a copper interconnection in the trench on the copper seed layer. The method may further comprise pre-processing the substrate in a pre-processing chamber.

Other systems, methods, features and advantages will be, or will become, apparent to one with skill in the art upon examination of the attached figures and following detailed description. Nothing in this section should be taken as a limitation on those figures and description. Further aspects and advantages are discussed below in conjunction with the embodiments.

DETAILED DESCRIPTION

Although an apparatus for manufacturing a semiconductor device and a method for manufacturing the semiconductor device using the same according to embodiments will be described in detail with reference to the accompanying drawings, it should be understood that numerous other modifications and embodiments can be devised by those skilled in the art that will fall within the spirit and scope of the principles of this disclosure.

Apparatus for Manufacturing Semiconductor Device

Figure 1:
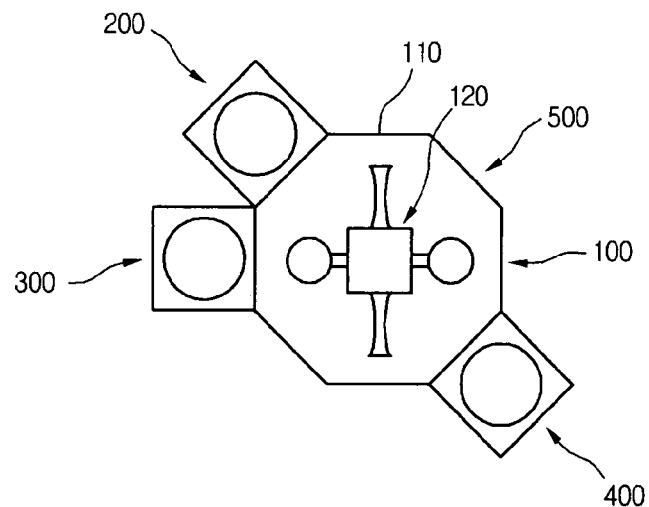
FIG. 1 is a plan view showing an apparatus for manufacturing a semiconductor device according to one embodiment.

FIG. 1 is a plan view showing an apparatus for manufacturing a semiconductor device according to one embodiment.

Referring to FIG. 1, the apparatus 500 includes a transfer chamber 100, a first process chamber 200, a second process chamber 300 and a third process chamber 400. The transfer chamber 100 includes a chamber body 110 and a robot arm unit 120. The robot arm unit 120 is disposed in the chamber body 110 to transfer a substrate (work piece or wafer) to the first to third process chambers 200 to 400.

In the embodiment of FIG. 1, the substrate comprises a silicon wafer. The silicon wafer includes a lower metal electrode or layer formed in a previous process, and an insulation layer in which a via hole and/or a trench that expose the lower metal electrode or layer are formed. In the embodiment, the insulation layer, for example, includes first and second interlayer dielectric layers (not shown), and a via hole and a trench have been formed in the insulation layer through the previous processing.

The first process chamber 200 is connected to the chamber body 110 of the transfer chamber 100. The first process chamber 200 forms a TiSiN layer on the inner walls of the via hole and the trench in the insulation layer. In the embodiment, the TiSiN layer can prevent diffusion of copper atoms or ions, which are included in a subsequently formed copper interconnection in the via hole and the trench, into the insulation layer (or oxygen atoms or ions from the insulation layer into the copper interconnection) without a complicated Atomic Layer Deposition (ALD) process.

Figure 2:
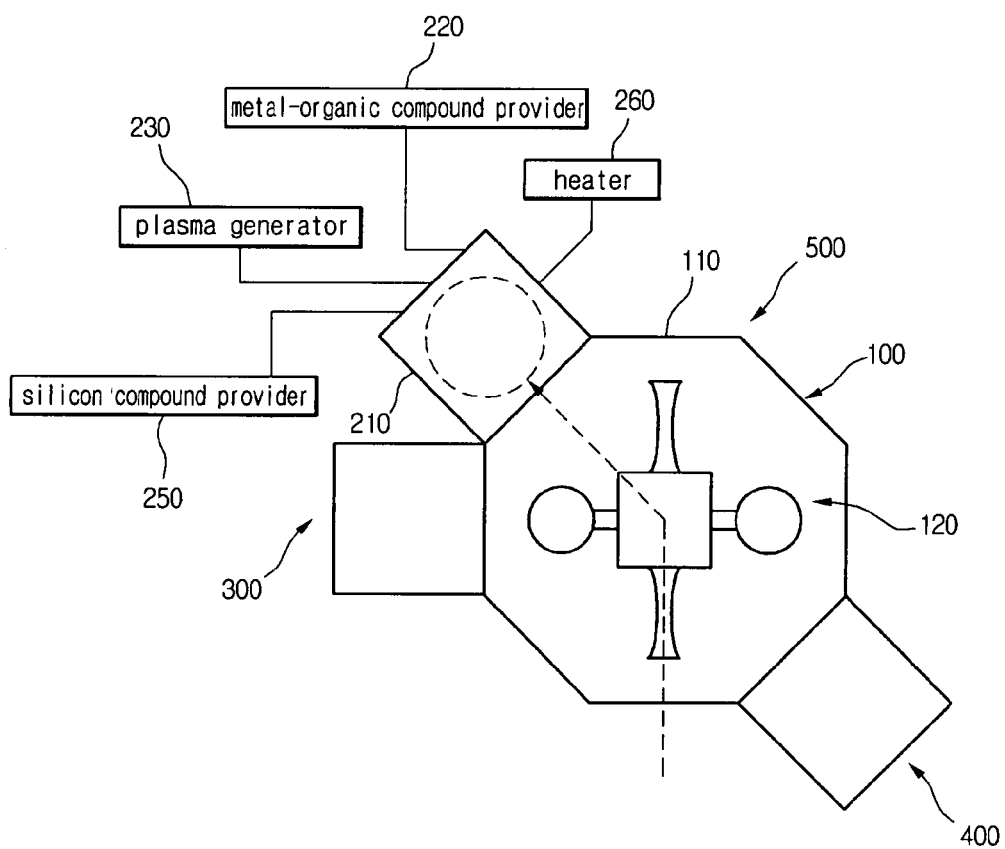
FIG. 2 is a plan view schematically showing the construction of the first process chamber shown in FIG. 1.

FIG. 2 is a plan view schematically showing the construction of the first process chamber shown in FIG. 1.

Referring to FIG. 2, the first process chamber 200 for forming the TiSiN layer in the via hole and the trench in the insulation layer is a Metal Organic Chemical Vapor Deposition (MODVD) apparatus that performs a MODVD process for depositing a thin film on the substrate from a metal organic compound.

The first process chamber 200 includes a first chamber body 210, a metal-organic compound provider 220, a plasma generator 230, and a silicon compound provider 250. Selectively, the first process chamber 200 can further include a heater 260.

The first chamber body 210 is connected to the transfer chamber 100. The robot arm unit 120 transfers the substrate, which is in the transfer chamber 100, to the first chamber body 210.

The metal-organic compound provider 220 provides the metal organic compound to the first chamber body 210. In the embodiment, the metal organic compound, which is provided to the first chamber body 210 in order to form the TiSiN layer, can include TDMAT (tetrakis dimethylaminotitanium, Ti[N(CH$_3$)$_2$]$_4$), TDEAT (tetrakis diethylaminotitanium, Ti[N(C$_2$H$_5$)$_2$]) and the like. As the TDMAT and TDEAT are provided inside the first chamber body 210, a TiCNH layer used for forming the TiSiN layer is formed on the inner walls of the via hole and the trench in the insulation layer of the substrate.

In order to more efficiently deposit the metal organic compound on the inner walls of the via hole and the trench in the insulation layer, the substrate may be heated by the heater 260. The substrate can be heated at a temperature of from about 200° C. to 500° C.

The plasma generator 230 generates plasma in the first chamber body 210. The plasma generator 230 can include an anode electrode (not shown) on which the substrate is disposed, a cathode electrode facing the anode electrode, and a plasma gas provider that provides plasma source gas to the first chamber body 210. In the embodiment, the plasma source gas can include hydrogen, ammonia and/or nitrogen, in which case the metal organic compound can be replaced with a volatile titanium compound, such as TiCl$_4$, TiF$_4$, Ti(OMe)$_4$, Ti(OEt)$_4$, etc.

In the embodiment of FIG. 2 (and other FIGS. having a plasma generator), the plasma generator 230 can form a plasma phase from the plasma source gas (or gasses; e.g., hydrogen and nitrogen), and thereby remove impurities, such as carbon and hydrogen, contained in the TiCNH layer and thus form a TiN layer on the inner walls of the via hole and the trench in the insulation layer of the substrate.

The silicon compound provider 250 provides a silicon compound to the first chamber body 210. In the embodiment, the silicon compound can include a silane gas (e.g., SiH$_4$ Si$_2$H$_6$ Si$_3$H$_8$, etc.). The TiSiN layer is formed on the inner walls of the via hole and the trench through reaction of the TiN layer and the silane (e.g., SiH$_4$) gas.

In the embodiment, at least two first process chambers 200 can be disposed in the transfer chamber 100 in order to improve the productivity.

Figure 3:
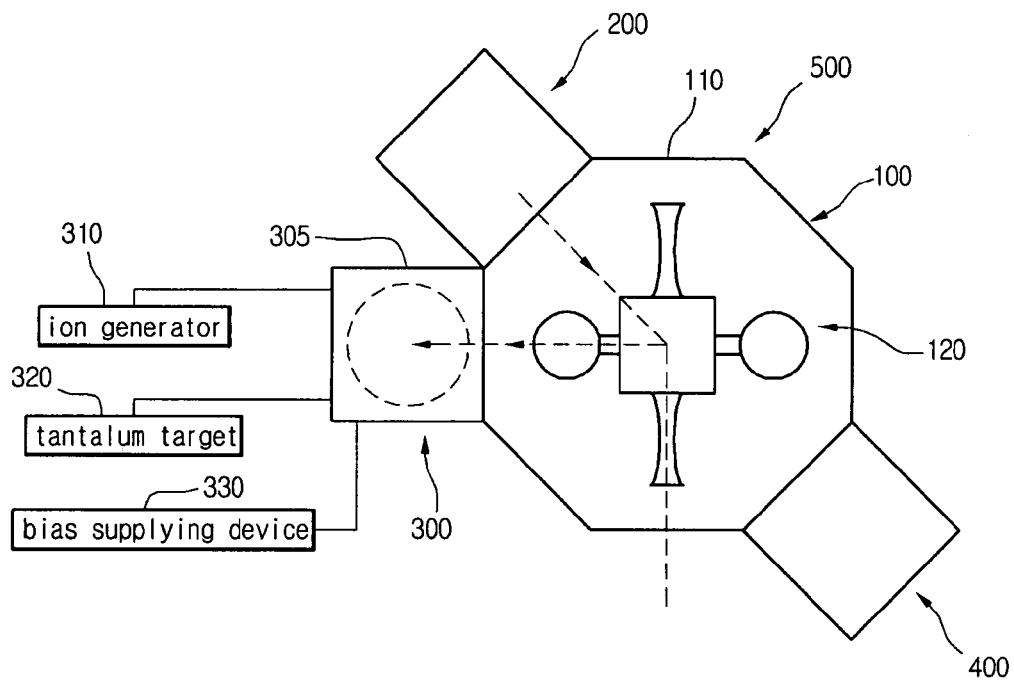
FIG. 3 is a plan view schematically showing the second process chamber of the apparatus shown in FIG. 1.

FIG. 3 is a plan view showing the second process chamber of the apparatus shown in FIG. 1.

Referring to FIG. 3, the second process chamber 300 forms a tantalum layer on the upper surface of the TiSiN layer formed in the first process chamber 200 and/or removes a portion of the TiSiN layer from the bottom surface of the trench.

The second process chamber 300 includes a second chamber body 305, an ion generator 310, a tantalum target 320 and a bias supplying device 330.

Figure 4:
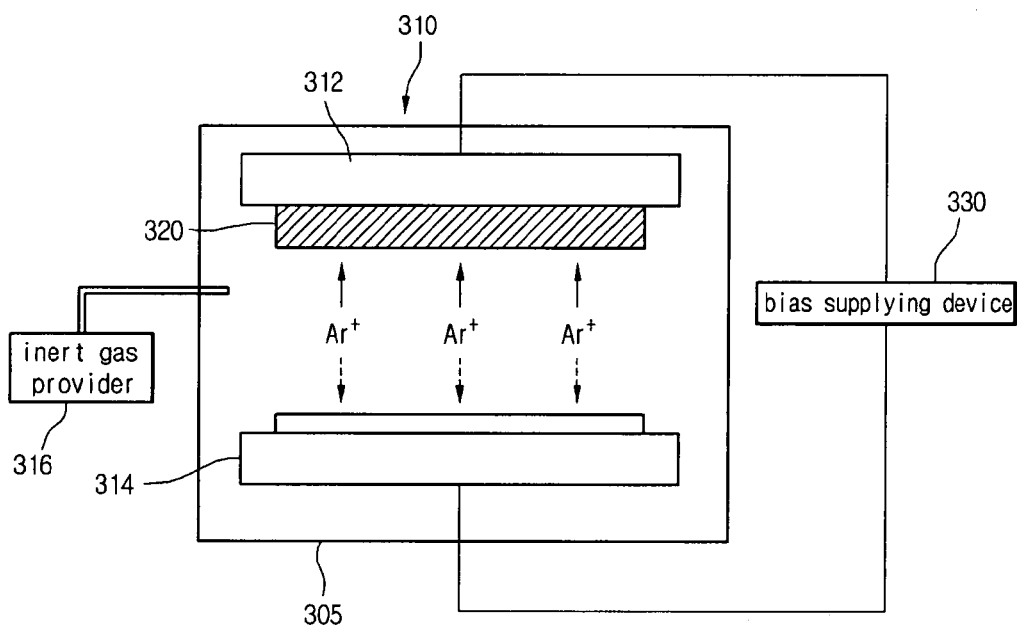
FIG. 4 is a sectional view showing the inner structure of the second process chamber shown in FIG. 3.

FIG. 4 is a sectional view showing the inner structure of the second process chamber shown in FIG. 3.

Referring to FIGS. 3 and 4, the second chamber body 305 of the second process chamber 300 is connected to the transfer chamber 100. The robot arm unit 120 transfers the substrate from the first process chamber 200 to the second process chamber 300.

The ion generator 310 is disposed in the second chamber body 305. The ion generator 310 includes an anode electrode 312, a cathode electrode 314 and an inert gas provider 316. The anode electrode 312 is disposed in the upper portion of the second chamber body 305. The cathode electrode 314 faces the anode electrode 312, and the substrate, on which the TiSiN layer is formed, is disposed on the cathode electrode 314. The inert gas provider 316, for example, provides inert gas between the anode electrode 312 and the cathode electrode 314. In one embodiment, argon gas can be used as the inert gas.

In addition, a power supplying device (not shown) is electrically connected to the anode electrode 312 and the cathode electrode 314 in order to supply power for forming plasma. In the embodiment, power output from the power supplying device may include one or more of alternating current power, direct current power and high frequency power.

The tantalum target 320 is disposed on the anode electrode 312. The tantalum target 320 generally includes pure tantalum, and, for example, may have a plate shape.

The bias supplying device 330, for example, is electrically connected to the power supplying device, and switches the polarity of power applied to the anode electrode 312 and the cathode electrode 314.

Hereinafter, a process for forming a tantalum layer in the second process chamber 300 will be described.

First, the inert gas provider 316 provides argon gas to the second chamber body 305. Then, positive voltage is provided to the anode electrode 312 and negative voltage is provided to the cathode electrode 314 through operations of the power supplying device and the bias supplying device 330.

The argon gas is dissociated into argon atoms, Ar ions and electrons by the voltage applied to the anode electrode 312 and the cathode electrode 314. The argon ions or atoms move toward the anode electrode 312 (which may be negatively charged, or to which positive voltage is applied) at a high speed. A portion of the TiSiN layer on the bottom surface of the trench and/or contact hole, is ion-etched by the argon ions and/or atoms, and thus is removed from the trench and/or the bottom surface of the contact hole. While the portion of the TiSiN layer is being removed, the lower metal electrode or layer under the bottom surface of the contact hole is partially etched. In such a case, the TiSiN layer on the sidewall of the trench and contact hole is rarely damaged because it is parallel with the moving direction of the argon ions (and atoms).

After the portion of the TiSiN layer formed on the bottom surface of the contact hole is removed as described above, the bias supplying device 330 provides the anode electrode 312 with negative voltage while providing the cathode electrode 314 with positive voltage. As a result, the argon atom moves toward the anode electrode 312 at a high speed. Then, the argon atom collides with the tantalum target 320, so that fine tantalum (e.g., Ta atoms, ions or relatively low molecular weight clusters) is separated from the tantalum target 320. The fine tantalum separated from the tantalum target 320 is deposited on the TiSiN layer and the exposed lower metal electrode or layer, thereby forming the tantalum layer.

In the embodiment of FIG. 3, the process temperature of the second chamber body 305 suitable for forming the tantalum layer corresponds to −25° C. to 250° C.

In the embodiment of FIG. 3, the reason for forming, the tantalum layer after removing the portion of the TiSiN layer on the bottom surface of the contact hole is because the TiSiN layer has poor electro-migration as compared with the tantalum layer. That is, although the TiSiN layer is suitable for preventing the diffusion of copper ions, it has poor electro-migration as compared with that of the tantalum layer, so the diffusion of the copper ions and/or oxygen atoms is suppressed by the TiSiN layer, and electrical contact with the lower metal electrode is achieved through the tantalum layer.

Figure 5:
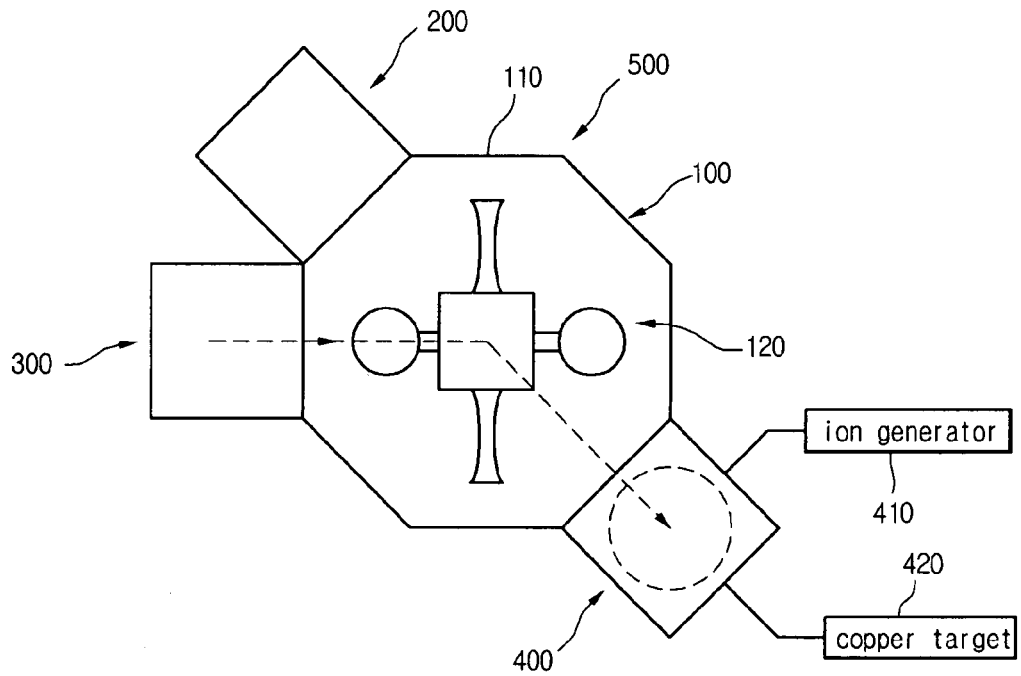
FIG. 5 is a plan view showing the third process chamber of the apparatus shown in FIG. 1 according to one embodiment.

FIG. 5 is a sectional view showing the third process chamber of the apparatus shown in FIG. 1 according to one embodiment.

Referring to FIG. 5, in the third process chamber 400, a copper seed layer is formed on the surface of the tantalum layer, before the copper interconnection is formed.

The third process chamber 400 includes a third chamber body 405, an ion generator 410 and a copper target 420.

Figure 6:
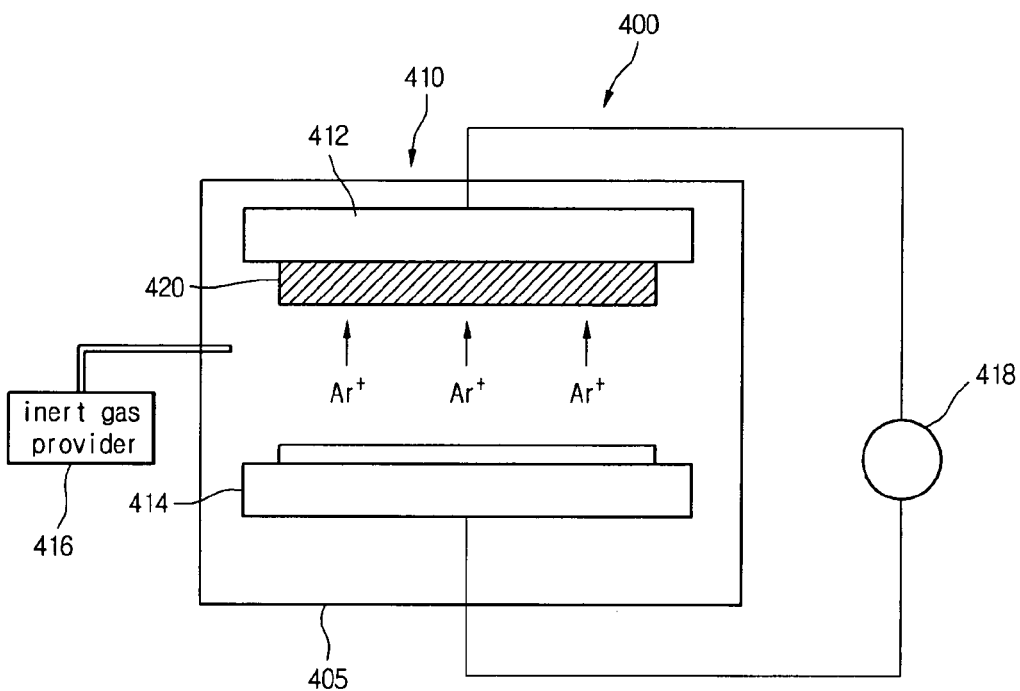
FIG. 6 is a sectional view showing the inner structure of the third process chamber shown in FIG. 5.

FIG. 6 is a sectional view showing the inner structure of the third process chamber shown in FIG. 5.

Referring to FIGS. 5 and 6, the third chamber body 405 of the third process chamber 400 is connected to the transfer chamber 100. The robot arm unit 120 of the transfer chamber 100 transfers the substrate from the second process chamber 300 to the third process chamber 400.

The ion generator 410 is disposed in the third chamber body 405. The ion generator 410 includes an anode electrode 412, a cathode electrode 414 and an inert gas provider 416. The anode electrode 412 is disposed in the upper portion of the third chamber body 405. The cathode electrode 414 faces the anode electrode 412, and the substrate, on which the TiSiN layer and the tantalum layer are formed, is disposed on the cathode electrode 414. The inert gas provider 416, for example, provides inert gas between the anode electrode 412 and the cathode electrode 414. In the embodiment, argon gas can be used as the inert gas.

In addition, a power supplying device 418 is electrically connected to the anode electrode 412 and the cathode electrode 414 in order to supply power for forming plasma. In the embodiment, power output from the power supplying device 418 may include one or more of alternating current power, direct current power and high frequency power.

The copper target 420 is disposed on the anode electrode 412. The copper target 420 includes pure copper, and, for example, may have a plate shape.

Referring to FIG. 6, for example, as the power supplying device 418 provides negative voltage to the anode electrode 412 and provides positive voltage to the cathode electrode 414, the argon gas is dissociated into argon atoms, Ar ions and electrons. The argon ions or atoms move toward the copper target 420 at a high speed so that the argon ions or atoms collide with the copper target 420. In this way, fine copper (similar to the fine tantalum above) is separated from the copper target 420, and then the fine copper is deposited with a thin thickness on the upper surface of the tantalum layer, thereby forming the copper seed layer.

Figure 7:
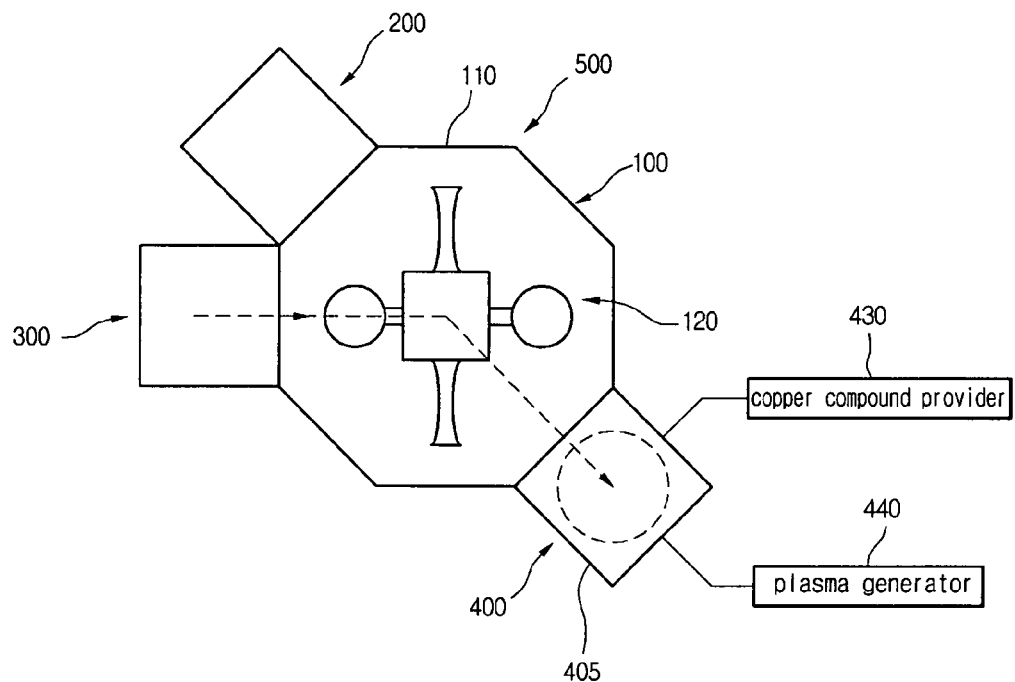
FIG. 7 is a plan view showing the third process chamber of the apparatus shown in FIG. 1 according to another embodiment.

FIG. 7 is a sectional view showing the third process chamber of the apparatus shown in FIG. 1 according to another embodiment.

Referring to FIG. 7, in the third process chamber 400, a copper seed layer may be formed on the surface of the tantalum layer before the copper interconnection is formed. The third process chamber 400 includes a third chamber body 405, a copper compound provider 430 and a plasma generator 440.

Figure 8:
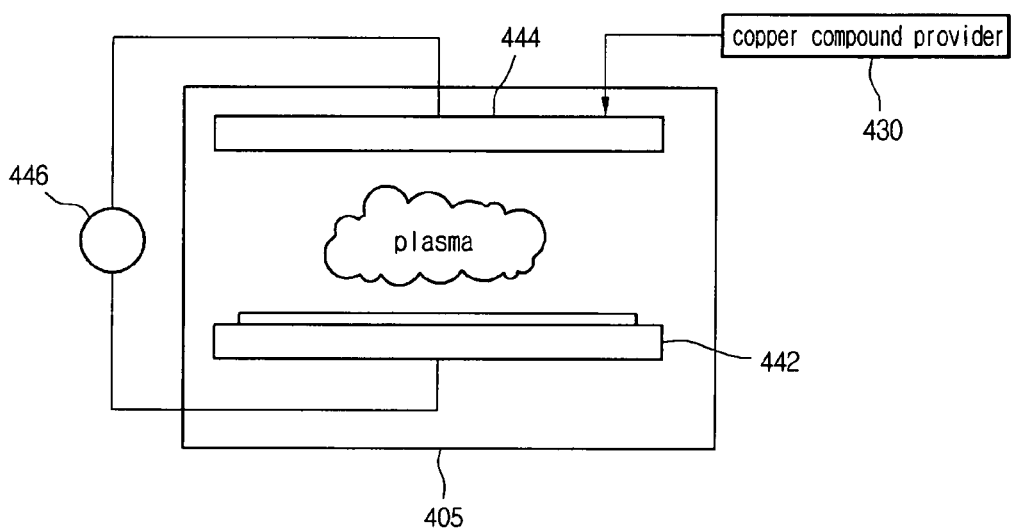
FIG. 8 is a sectional view showing the inner structure of the third process chamber shown in FIG. 7.

FIG. 8 is a sectional view showing the inner structure of the third process chamber shown in FIG. 7.

Referring to FIGS. 7 and 8, the third chamber body 405 of the third process chamber 400 is connected to the transfer chamber 100. The robot arm unit 120 of the transfer chamber 100 transfers the substrate from the second process chamber 300 to the third process chamber 400.

The plasma generator 440 is disposed in the third chamber body 405. The plasma generator 440 includes an anode electrode 442, a cathode electrode 444, and the copper compound provider 430 that provides inert gas and copper compound.

The anode electrode 442 is disposed in the lower portion of the third chamber body 405. The cathode electrode 444 faces the anode electrode 442. The substrate, on which the TiSiN layer and the tantalum layer are formed, is disposed on the anode electrode 442. The copper compound provider 430 provides the inert gas and the copper compound between the anode electrode 442 and the cathode electrode 444. In addition, a power supplying device 446 is electrically connected to the anode electrode 442 and the cathode electrode 444 in order to supply power for forming plasma. In the embodiment, power output from the power supplying device 446 may include one or more of alternating current power, direct current power and high frequency power.

Referring to FIG. 8, for example, as the power supplying device 446 provides negative voltage to the anode electrode 442 and provides positive voltage to the cathode electrode 444, the inert gas is ionized and then the ionized inert gas and the copper compound are subject to a gas phase reaction, thereby forming ionized copper species, copper-containing radicals and/or copper particles. The copper is deposited with a thin thickness on the upper surface of the tantalum layer, thereby forming the copper seed layer. Similar to the interchangeability of the PVD and CVD chambers 400 and 500 of FIGS. 7 and 8, respectively, PVD and CVD chambers may be interchangeable for the TiSiN-forming first chamber 200 (see FIGS. 1-2).

Figure 9:
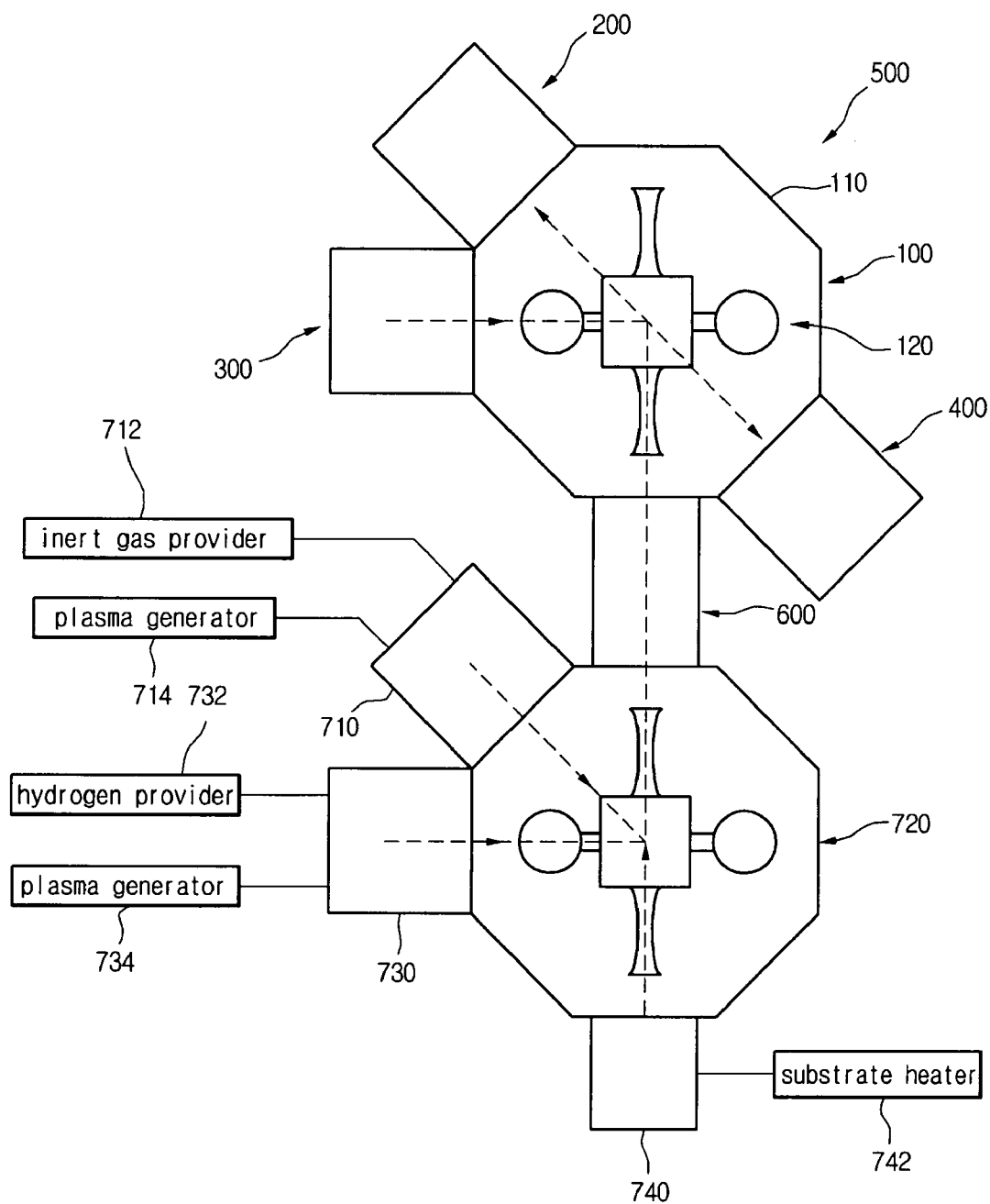
FIG. 9 is a plan view showing an apparatus for manufacturing a semiconductor device according to another embodiment.

FIG. 9 is a plan view showing an apparatus for manufacturing a semiconductor device according to another embodiment. The apparatus according to another embodiment is substantially identical to the apparatus described with reference to FIGS. 1 to 8, except for a cleaning chamber, a residue removal chamber and a dry chamber. Accordingly, the same reference numerals and names will be assigned to the elements identical to those of the apparatus described with reference to FIGS. 1 to 8.

Referring to FIG. 9, the apparatus further includes the cleaning chamber 710. The cleaning chamber 710 is connected to a pre-processing transfer chamber 720. The pre-processing transfer chamber 720 is connected to the transfer chamber 100 through a transfer duct 600.

The cleaning chamber 710 includes an inert gas provider 712, which provides inert gas in order to dry-clean the trench and via hole in the insulating layer using a plasma before forming the TiSiN layer, the tantalum layer and the copper seed layer in the trench and the via hole, and a plasma generator 714.

In addition, the residue removal chamber 730 can be connected to the pre-processing transfer chamber 720. The residue removal chamber 730 removes residues or a residual oxide layer remaining in the via hole and the trench. To this end, the residue removal chamber 730 includes a hydrogen provider 732 and a plasma generator 734. The hydrogen provider 732 provides hydrogen (e.g., from dihydrogen or another hydrogen source, such as ammonia, hydrazine or silane) to the residue removal chamber 730 and the plasma generator 734 generates hydrogen plasma in order to remove the residues or residual oxide layer using the hydrogen source gas.

In the embodiment of FIG. 9, the cleaning chamber 710 and the residue removal chamber 730 are connected to the pre-processing transfer chamber 720, respectively. However, the cleaning chamber 710 can clean the trench and the via hole or remove the residues or the residue oxide layer remaining in the via hole and the trench. To this end, it is preferable that the hydrogen provider is also connected to the cleaning chamber 710.

Referring to FIG. 9, the dry chamber 740 can be connected to the pre-processing transfer chamber 720. The dry chamber 740 removes moisture generated when forming the trench and the via hole in the insulation layer of the substrate through wet etching. To this end, the dry chamber 740 can include a substrate heater 742 for drying the insulation layer. For example, the substrate heater 742 can include a halogen lamp for heating the substrate, and the dry chamber 740 can have an inner (or chamber) temperature of from about 200° C. to 500° C. in order to dry the insulation layer of the substrate. In the embodiment, at least two dry chambers 740 can be connected to the pre-processing transfer chamber 720.

Method of Manufacturing Semiconductor Device

FIGS. 10 through 18 include a flow diagram (FIG. 11) and sectional views sequentially showing the procedure for manufacturing a semiconductor device according to one embodiment.

Figure 10:
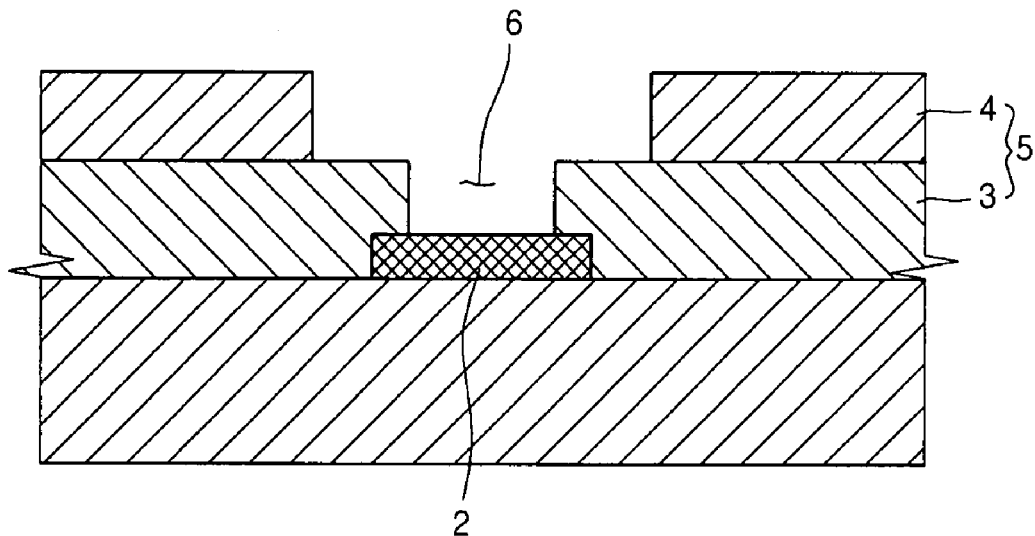
FIG. 10 is a flow diagram showing a method for manufacturing a semiconductor device according to one embodiment.

Referring to FIG. 10, an insulation layer 5 is formed on a substrate (not numbered) through a previous process. In detail, a lower metal interconnection 2 is formed on the upper surface of the substrate 1 and the insulation layer 5 is formed on the lower metal interconnection 2. In the embodiment, the insulation layer 5 includes first and second interlayer dielectric layers 3 and 4. The first interlayer dielectric layer 3, for example, includes an FSG layer and the second interlayer dielectric layer 4, for example, includes an oxide layer.

After forming the first and second interlayer dielectric layers 3 and 4, the first and second interlayer dielectric layers 3 and 4 are etched, so that the trench 6 is formed in the first and second interlayer dielectric layers 3 and 4. In the embodiment, the insulation layer 5 includes the trench (not numbered) substantially in first interlayer dielectric layer 3 and the contact hole 6 in second interlayer dielectric layer 4. However, a single-layered insulation layer can also be used.

Figure 11:
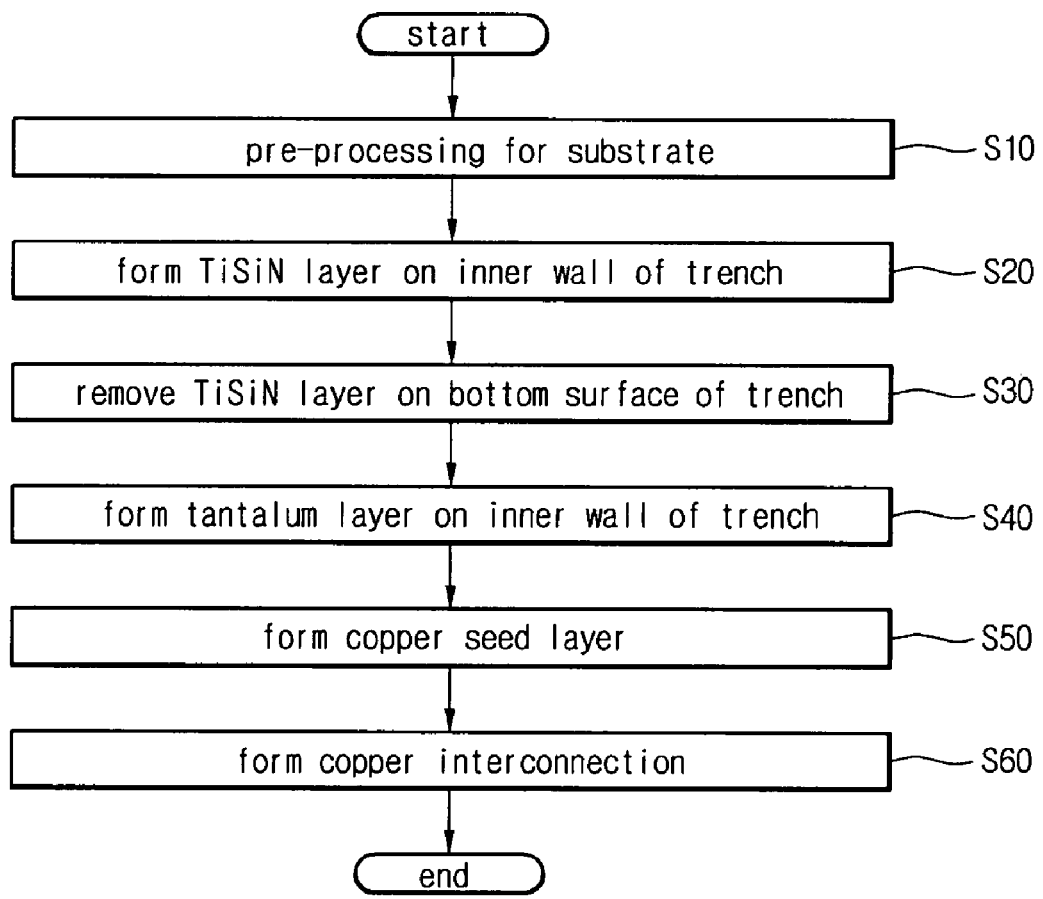
FIGS. 11 to 18 are sectional views sequentially showing the procedure for manufacturing a semiconductor device according to an exemplary process.

Referring to FIG. 11, in order to manufacture the semiconductor device, in step S10, a pre-processing process is performed for the substrate 1 having the insulation layer 5 thereon with the trench 6 therein. The pre-processing process includes a process of drying the insulation layer 5, a residue removal process (e.g., removing residues and a remaining oxide layer in the contact hole 6, and a cleaning process of cleaning the substrate 1 having the insulation layer 5 from which the residues are removed.

First, the dry process is performed for the substrate 1. That is, the substrate 1 and the insulation layer 5 are dried in the dry chamber 740. The dry temperature is from about 200° C. to 500° C.

Then, the residue removal process is performed. That is, the robot arm unit of the pre-processing transfer chamber 720 unloads the substrate 1 from the dry chamber 740 and loads the substrate 1 into the residue removal chamber 730. The residue removal chamber 730 removes the residues and remaining oxide layer in the contact hole 6 using a hydrogen-containing plasma.

Next, the cleaning process is performed. That is, the substrate 1, from which the residues are removed by the residue removal chamber 730, is unloaded from the pre-processing transfer chamber 720 and then is loaded into the cleaning chamber 710. In the cleaning chamber 710, the insulation layer 5 of the substrate 1 is dry-cleaned using an argon plasma. In this way, the pre-processing process is terminated.

After the pre-processing process for the substrate 1 is terminated, the substrate 1 having the dry-cleaned insulation layer 5 is unloaded from the pre-processing transfer chamber 720 and then is loaded into the robot arm unit 120 of the transfer chamber 100.

Figure 12:
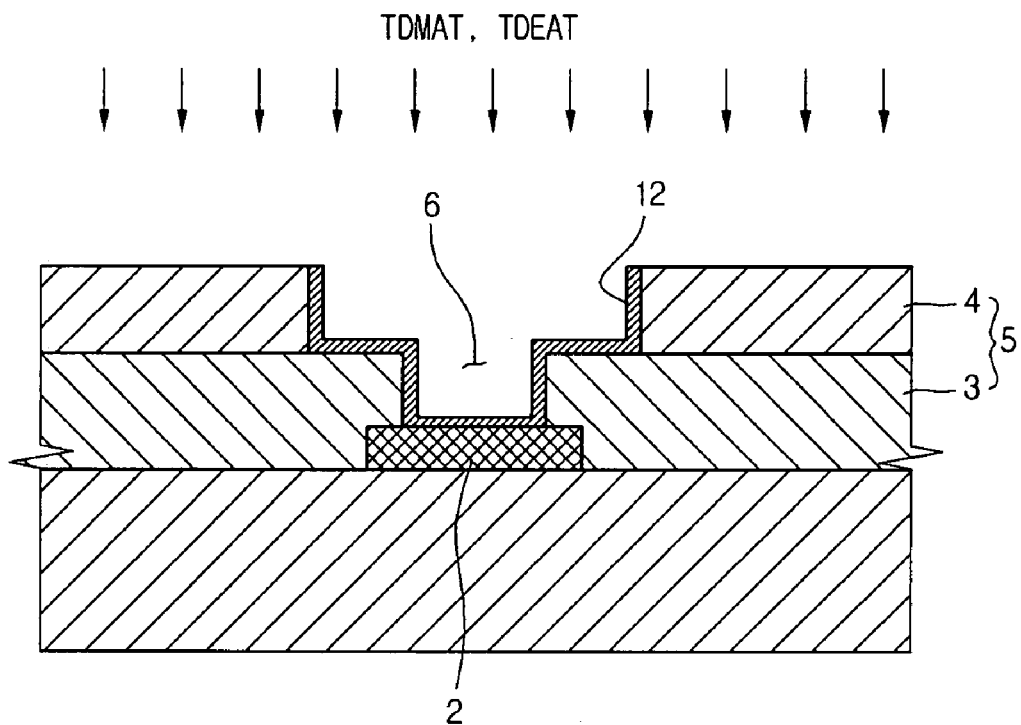

Referring to FIGS. 11 and 12, in step S20, a process is performed to form the TiSiN layer on the inner walls of the contact hole 6 formed in the insulation layer 5 of the substrate 1.

Referring to FIGS. 2, 9 and 12, in order to form the TiSiN layer, the substrate 1 loaded into the transfer chamber 100 from the pre-processing transfer chamber 720 is loaded into the first process chamber 200. Then, the substrate 1 is heated by the heater 260 at a designated temperature, and then a metal organic or titanium-containing compound, such as TDMAT, TDEAT, or $TiCl_4$, is provided to the heated substrate 1 by the metal-organic compound provider 220, so that a TiCNH layer 12 is formed on the inner walls of the trench (not numbered) and contact hole 6.

Figure 13:
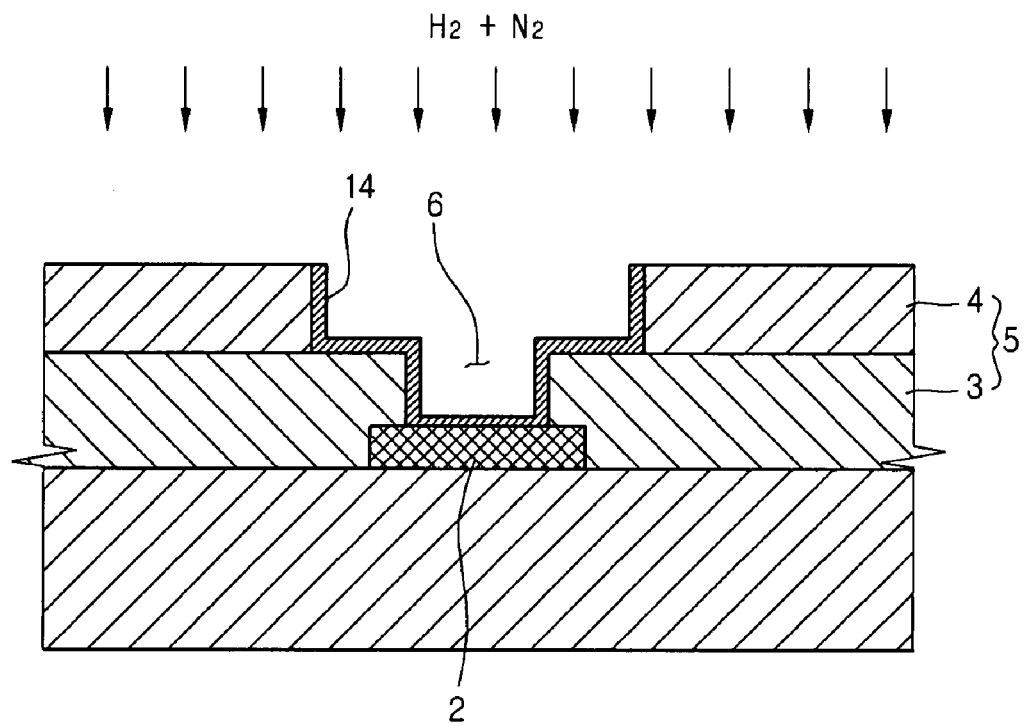

After forming the TiCNH layer 12 on the inner walls of the trench (not numbered) and contact hole 6, the plasma generator 230 generates a plasma containing hydrogen and/or nitrogen in the first process chamber 200 using hydrogen and nitrogen source gasses (see, e.g., FIG. 13). Thus, impurities (e.g., carbon and hydrogen) contained in the TiCNH layer 12 can be removed from the TiCNH layer 12. As a result, the TiN layer 14 having few or substantially no impurities is formed on the inner walls of the trench (not numbered) and contact hole 6.

Figure 14:
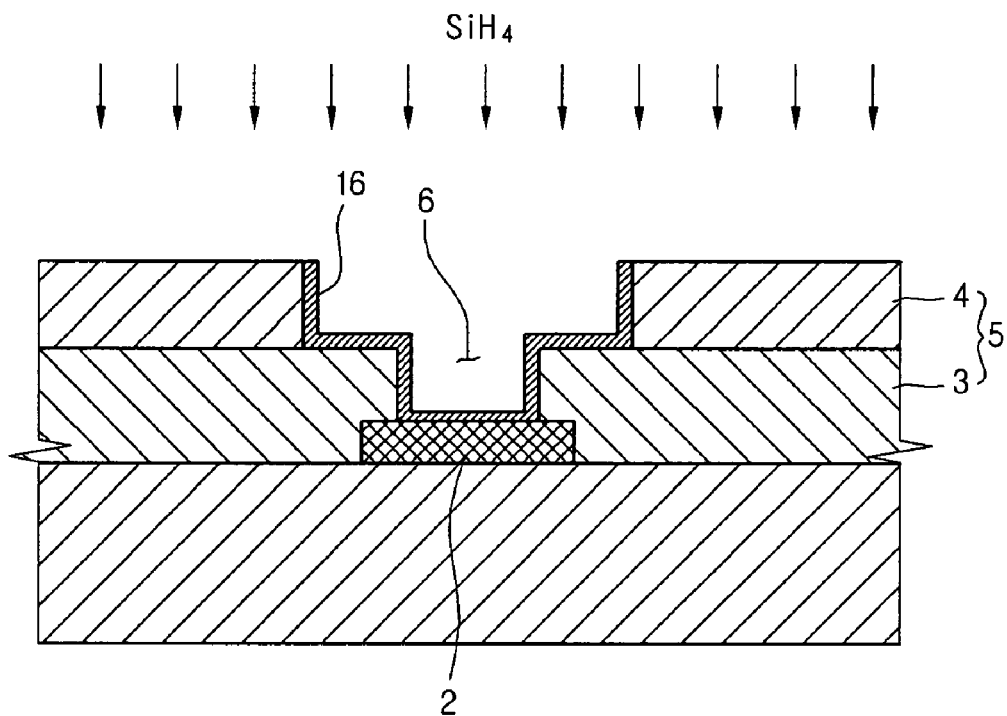

Then, as shown in FIGS. 2, 9 and 14, a silicon compound (e.g., $SiH_4$ gas) is provided into the first process chamber 200 from the silicon compound provider 250, so that the TiSiN layer 16 is formed on the inner walls of the trench (not numbered) and contact hole 6 through reaction of the $SiH_4$ gas and the TiN layer 14.

After forming the TiSiN layer 16 on the inner walls of the trench (not numbered) and contact hole 6, the substrate 1 disposed in the first process chamber 200 is loaded into the second process chamber 300 by the robot arm unit 120 of the transfer chamber 100. A tantalum layer may then be formed on the TiSiN layer 16, after forming the TiSiN layer 16.

Figure 15:
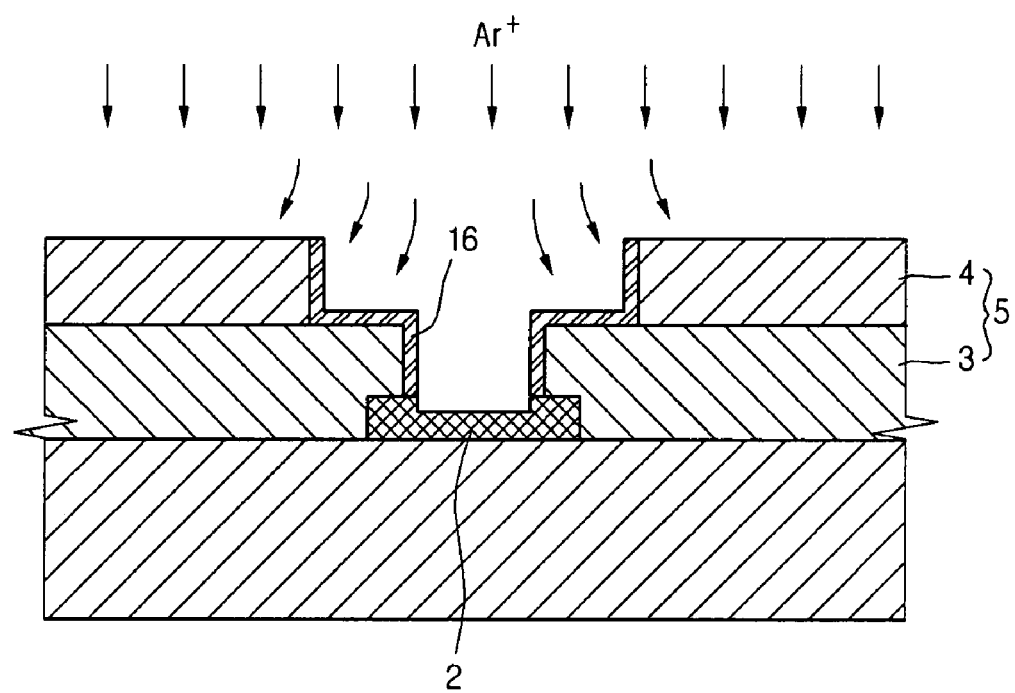

Referring to FIGS. 4, 11 and 15, in step 30, a portion of the TiSiN layer 16 covering the bottom surface of the contact hole 6 is removed by argon ions and/or atoms generated in the second process chamber 300, and thus a portion of the TiSiN layer 16 covering the lower metal interconnection 2 is removed.

Herein, Argon ions go straightly toward the substrate by a bias voltage, thereby removing the portion of the TiSiN layer 16 covering the bottom surface of the contact hole 6. At the same time, Tantalum ions generated from the tantalum target 320 go toward the TiSiN layer 16 on the sidewall of the trench, thereby depositing on the sidewall of the trench. Because the bias voltage is not so enough that tantalum ions go toward the bottom surface of the contact hole 6. Thus, a portion of the TiSiN layer 16 covering the lower metal interconnection 2 can be removed.

Herein, a portion of the underlying metal layer 2 may be removed when the TiSiN layer 16 is removed.

Figure 16:
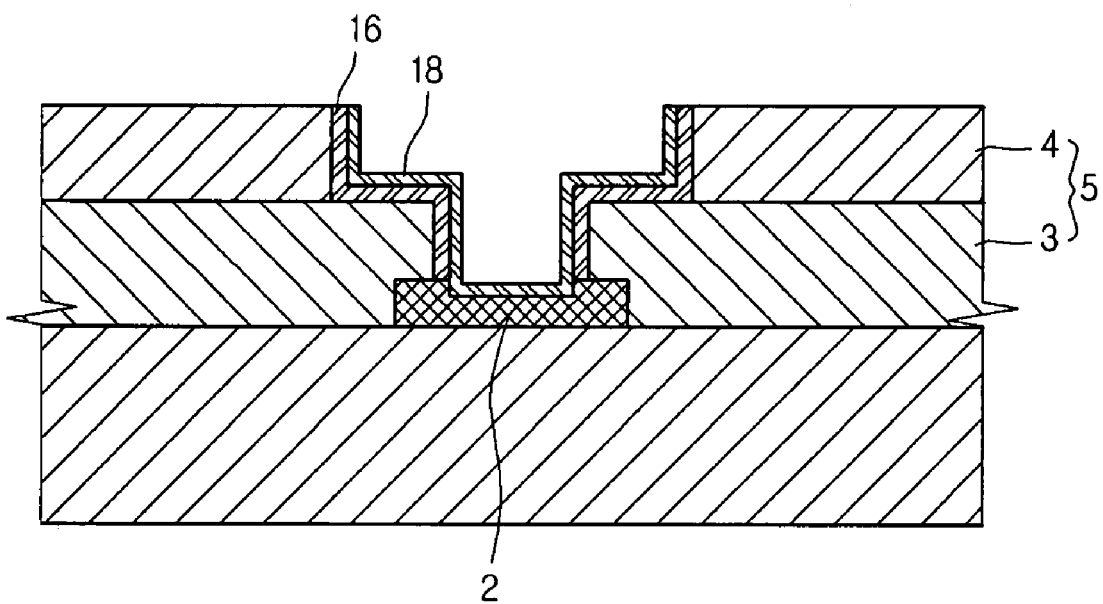

Referring now to FIGS. 3, 11 and 16, in step S40 (FIG. 11), the argon ions and/or atoms generated in the second process chamber 300 collide with the tantalum target 320, so that tantalum is deposited from the tantalum target 320, thereby forming the tantalum layer 18 on the TiSiN layer 16 and the exposed lower metal interconnection 2 as shown in FIG. 16. A thickness of the tantalum layer 18 may be from about 2 nm to 10 nm.

Then, the substrate 1 disposed in the second process chamber 300 is loaded into the third process chamber 400 by the robot arm unit 120.

Figure 17:
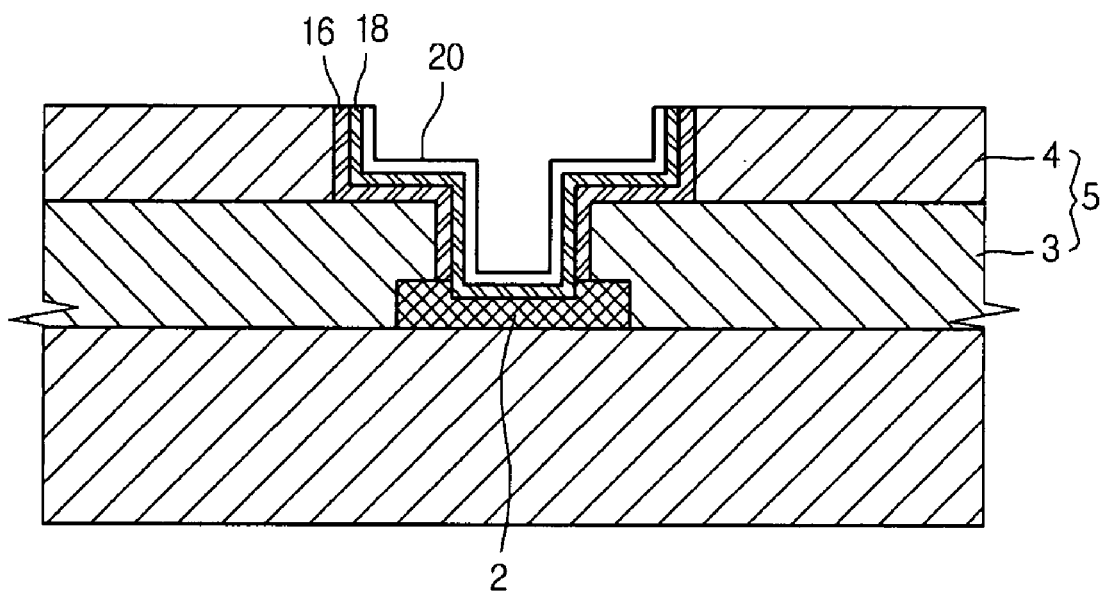

Referring to FIGS. 6, 11 and 17, in step S50 (FIG. 11), the copper seed layer 20 is formed on the surface of the tantalum layer 18 in the trench (not numbered) and contact hole 6 of the substrate 1 disposed in the third process chamber 400. The copper seed layer 20, for example, can be formed by using a sputtering method from a copper target or a Chemical Vapor Deposition (CVD) method using a copper compound.

Figure 18:
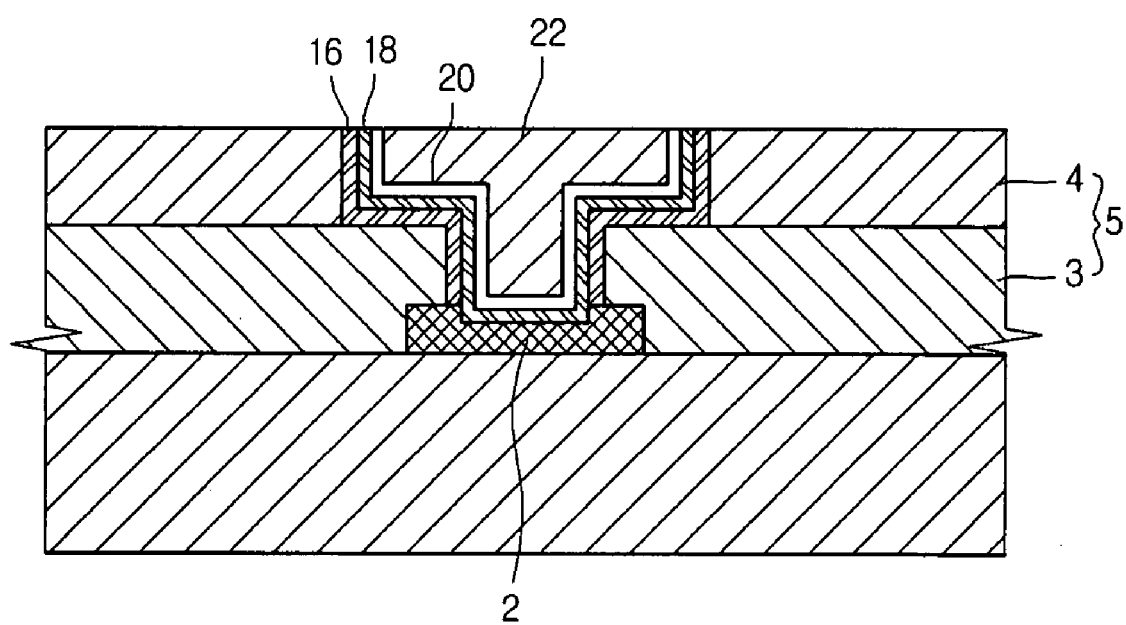

Referring to FIGS. 11 and 18, in step S60 (FIG. 11), the copper interconnection 22 is formed in the trench (not numbered) and contact hole 6 of the substrate 1, so that the semiconductor device having a layer of copper metallization thereon is manufactured.

As described above, after forming the TiSiN layer, which prevents diffusion of copper ions, on the inner walls of the trench and contact hole formed in the insulation layer of the substrate, a portion of the TiSiN layer in contact with the lower metal interconnection is etched, a tantalum layer (or other conductive adhesive layer, such as Ti or Al) is formed on the TiSiN layer in contact with the exposed lower metal interconnection, a copper seed layer is formed on the tantalum/adhesive layer, and then the copper interconnection is formed by depositing copper (e.g., by electroplating or electroless plating) onto the copper seed layer. In this way, the copper interconnection can be efficiently formed.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive. The above disclosed subject matter is to be considered illustrative, and not restrictive, and the appended claims are intended to cover all such modifications, enhancements, and other embodiments, which fall within the true spirit and scope of the present invention.

What is claimed is:

1. A method for manufacturing a semiconductor device comprising the steps of:

forming an insulation layer having a trench that exposes a lower interconnection on a substrate, wherein the insulation layer comprises a first interlayer dielectric layer including fluorine silicate glass (FSG) and a second interlayer dielectric layer including an oxide;

pre-processing the insulation layer having the trench on the substrate;

forming a TiSiN layer on inner walls and a bottom surface of the trench in a first process chamber;

exposing the lower interconnection by selectively removing a portion of the TiSiN layer that covers the bottom surface of the trench in a second process chamber;

forming a tantalum layer on the TiSiN layer and the lower interconnection exposed in the bottom surface of the trench in the second process chamber;

forming a copper seed layer on the tantalum layer in a third process chamber; and forming a copper interconnection in the trench on the copper seed layer.

2. The method as claimed in claim 1, wherein the step of forming the TiSiN layer comprises:

forming a TiCNH layer on the inner walls of the trench by providing an organotitanium compound in the first process chamber;

forming a TiN layer on the inner walls of the trench by processing the TiCNH layer using hydrogen and nitrogen plasma in the first process chamber; and providing a silicon compound onto the TiN layer in the first process chamber.

3. The method as claimed in claim 1, wherein the pre-processing process comprises drying the insulation layer, removing residues from the insulation layer, and cleaning the insulation layer from which the residues are removed.

4. The method as claimed in claim 3, wherein drying the insulation layer comprises drying the substrate and the insulation layer with a halogen lamp in a dry chamber.

5. The method as claimed in claim 3, wherein removing residues from the insulation layer comprises removing residues remaining in the trench using a hydrogen plasma in a residue removal chamber.

6. The method as claimed in claim 3, wherein cleaning the insulation layer comprises dry-cleaning the substrate and insulation layer using argon ions in a cleaning chamber.

7. The method as claimed in claim 2, wherein the organotitanium compound comprises TDMAT (tetrakis-dimethylaminotitanium) or TDEAT (tetrakis-diethylaminotitanium).

8. The method as claimed in claim 2, wherein the silicon compound includes $SiH_4$ gas.

9. The method as claimed in claim 3, wherein drying the insulation layer comprises drying the substrate and the insulation layer with a halogen lamp in a dry chamber, removing residues from the insulation layer comprises removing residues remaining in the trench using a hydrogen plasma in a residue removal chamber, and cleaning the insulation layer comprises dry-cleaning the substrate and insulation layer using argon ions in a cleaning chamber.

10. The method as claimed in claim 9, wherein the dry chamber, the residue removal chamber, and the cleaning chamber are connected to each other.

11. The method as claimed in claim 4, wherein the drying temperature is from 200° C. to 500° C.

12. The method as claimed in claim 1, wherein exposing the lower interconnection comprises etching the TiSiN layer with argon ions.

13. The method as claimed in claim 1, further comprising removing a portion of the lower interconnection when selectively removing the TiSiN layer.

14. The method as claimed in claim 1, wherein the thickness of the tantalum layer is from about 2 nm to 10 nm.

15. The method as claimed in claim 1, wherein forming the copper seed layer comprises sputtering from a copper target.

16. The method as claimed in claim 1, wherein forming the copper seed layer comprises chemical vapor deposition of a copper compound.

17. The method as claimed in claim 1, wherein forming a copper interconnection comprises electroplating or electroless plating copper onto the copper seed layer.

18. The method as claimed in claim 2, further comprising heating the substrate with a heater before forming the TiCNH layer.

19. The method as claimed in claim 1, wherein forming the TiSiN layer comprises forming a TiN layer using $TiCl_4$ and a plasma containing hydrogen and nitrogen.

* * * * *